United States Patent
Yoshizawa et al.

(10) Patent No.: US 7,683,269 B2
(45) Date of Patent: Mar. 23, 2010

(54) THIN FILM DEVICE AND METHOD FOR MANUFACTURING THE SAME

(75) Inventors: Toshiyuki Yoshizawa, Tokyo (JP); Masaomi Ishikura, Tokyo (JP); Masahiro Miyazaki, Tokyo (JP); Akira Furuya, Tokyo (JP); Nobuyuki Okuzawa, Tokyo (JP)

(73) Assignee: TDK Corporation, Tokyo (JP)

(*) Notice: Subject to any disclaimer, the term of this patent is extended or adjusted under 35 U.S.C. 154(b) by 223 days.

(21) Appl. No.: 12/053,317

(22) Filed: Mar. 21, 2008

(65) Prior Publication Data

US 2008/0236885 A1 Oct. 2, 2008

(30) Foreign Application Priority Data

Mar. 30, 2007 (JP) .............................. 2007-093849

(51) Int. Cl.
*H01L 23/28* (2006.01)
(52) U.S. Cl. .................. 174/524; 174/533; 361/538
(58) Field of Classification Search ............... 174/521, 174/524, 533; 257/787, 788; 361/535, 538
See application file for complete search history.

(56) References Cited

U.S. PATENT DOCUMENTS

| | | | |
|---|---|---|---|
| 6,313,402 B1* | 11/2001 | Schreiber et al. | 174/527 |
| 6,350,953 B1* | 2/2002 | Franzen | 174/528 |
| 7,570,477 B2* | 8/2009 | Kayatani | 361/306.3 |
| 2005/0218491 A1* | 10/2005 | Sasaki et al. | 257/678 |
| 2007/0247821 A1* | 10/2007 | Kobayakawa et al. | 361/743 |
| 2007/0287230 A1* | 12/2007 | Kuramochi et al. | 438/128 |

FOREIGN PATENT DOCUMENTS

| | | |
|---|---|---|
| JP | A-50-84866 | 7/1975 |
| JP | A-4-120713 | 4/1992 |
| JP | A-4-123413 | 4/1992 |
| JP | A-5-129149 | 5/1993 |
| JP | A-11-135360 | 5/1999 |
| JP | A-2002-033559 | 1/2002 |
| JP | A-2002-344280 | 11/2002 |
| JP | A-2004-172348 | 6/2004 |
| JP | A-2005-109410 | 4/2005 |
| JP | A-2006-228907 | 8/2006 |

OTHER PUBLICATIONS

Japanese Office Action for Application No. 2007-093849, Issued Mar. 17, 2009.

* cited by examiner

*Primary Examiner*—Hung V Ngo
(74) *Attorney, Agent, or Firm*—Oliff & Berridge, PLC

(57) ABSTRACT

A terminal electrode body on a substrate is exposed relative to a resin layer, protruding out beyond the side of the resin layer. That is, the terminal electrode body is not covered by the resin layer. The electronic element is covered by an insulating layer and the terminal electrode body and the electronic element are electrically connected. Hence, an electric signal applied to the terminal electrode body can be transmitted to the electronic element. A cover layer covers the terminal electrode body and the boundary between the terminal electrode body and the resin layer.

7 Claims, 9 Drawing Sheets

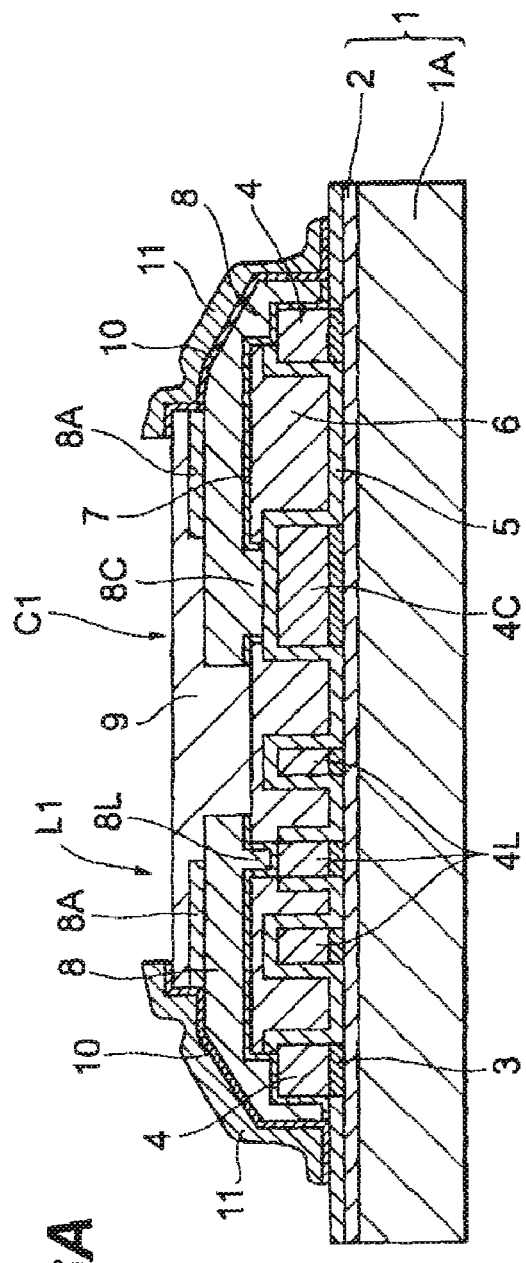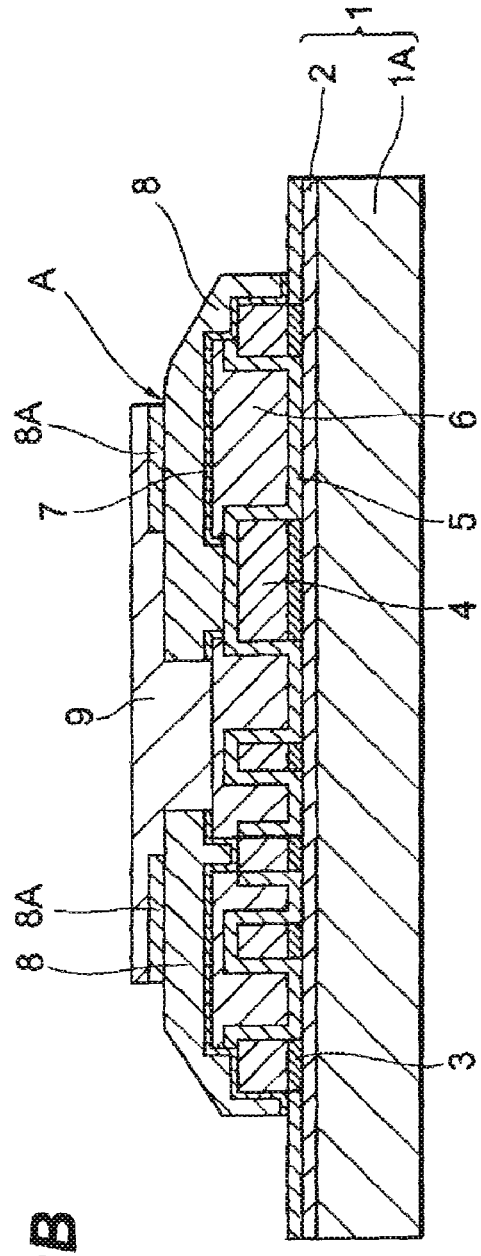

THIN FILM DEVICE AND METHOD FOR MANUFACTURING THE SAME

BACKGROUND OF THE INVENTION

1. Field of the Invention

The present invention relates to a thin film device in which there is formed an electronic element such as a capacitor or a coil, and to a method for manufacturing such a thin film device.

2. Related Background Art

A thin film device has plural electronic elements in its interior, with a protective resin film being formed on the elements, covering them entirely. A soft resin film and a hard ceramic substrate are sliced simultaneously during separation of plural thin film devices through dicing of the wafer where the thin film devices are formed. In such cases there occur delamination between the resin and the substrate, and gumming of the dicing blade by the protective resin film, all of which detracts from mass productivity. Therefore, a predefined metal layer is coated on the terminal electrodes of the thin film device. Preferably, such terminal electrodes are made to protrude beforehand out of the resin protective film at the stage of thin film device integration on the wafer. Doing so allows slicing the ceramic substrate alone at the stage of thin film device separation, thereby increasing mass productivity while expanding the bonding surface area with outer terminals formed by plating, enhancing thus bonding reliability through a more secure bonding.

Such thin film devices are disclosed in, for instance, Japanese Unexamined Patent Application Laid-open Nos. 2002-33559, 2004-172348 and 2005-109410.

However, delamination between the resin protective film and the terminal electrode body may also occur even when the outer terminals are exposed to the exterior of the resin protective film. As a result of diligent research, the present inventors found that the reason for this lies in the dissolution of metal oxides formed between the underside of the resin protective layer and the top of the terminal electrode body during the step of washing with an acidic solvent, and which eventually gives rise to delamination. Examples of such metal oxides include, for instance, $Cu_2O$, $CuO$ or the like. Such metal oxides may form through natural oxidation of a metal material prior to formation of the resin protective film. However, oxidation progresses further during curing of the resin protective film by heating, resulting in the formation of substantial amounts of metal oxides that become sufficient cause for delamination. Even if complete delamination does not occur, etching of the oxides by the acidic solvent results in interstices forming between the resin protective film and the terminal metal (outer terminals) that are manufactured last. Such interstices cause delamination later and give rise to variation in the electric characteristics of the finished articles, thus impairing reliability.

SUMMARY OF THE INVENTION

In the light of the above problems, it is an object of the present invention to provide a highly reliable thin film device and a method for manufacturing the same.

In order to solve the above problems, the thin film device according to the present invention is a thin film device in which an electronic element is formed on a substrate, comprising; a resin layer covering the electronic element; a terminal electrode body electrically connected to the electronic element and exposed to the exterior relative to the resin layer on the substrate; and a cover layer covering a boundary between the terminal electrode body and the resin layer, wherein the cover layer comprises a material having a slower etching rate in an etching solution than the etching rate of an oxide of the terminal electrode body.

Thanks to such a structure, the boundary can be covered by the cover layer having high etching resistance, even when the thin film device is exposed to the etching solution for etching the oxide of the terminal electrode body. This inhibits as a result delamination of the resin layer, and reduces variation in the electric characteristics of the finished article. The thin film device boasts thus excellent reliability. The electronic element is protected by an insulating layer, while the terminal electrode body and the electronic element are electrically connected Hence, an electric signal applied to the terminal electrode body can be transmitted to the electronic element.

Preferably, the thin film device further comprises a metal layer that covers the cover layer. In that case, the metal layer is exposed to the exterior, allowing wiring or the like to be electrically connected to the metal layer. The metal layer comprises preferably a metal having excellent contact with wiring and mat does not oxidize readily.

Preferably, the terminal electrode body comprises a layer comprising Cu or Al, and the cover layer comprises a layer comprising Cr or Ti. Preferably, also, the metal layer comprises a layer comprising Sn or Au. The terminal electrode body comprising Cu (or Al) oxidizes readily. Copper oxide exhibits a large etching rate in acidic etching solutions, but the etching rate of Cr or Ti is smaller than that of the etching solution for copper oxide. Herein Cr, which is a metal having excellent adherence, sufficiently inhibits penetration of the etching solution into the boundary. Sn or Au is a metal having high oxidation resistance. A surface of Sn or Au, therefore, does not oxidize readily, affording thus excellent wiring contact reliability even when the thin film device is left to stand.

Preferably, an oxide of the terminal electrode body is interposed between the resin layer and the region of the terminal electrode body covered by the resin layer. Such oxide between the resin layer and the terminal electrode body contributes to enhancing adherence between the layers.

Preferably, the angle formed between the exposed face of the terminal electrode body that is furthest away from the substrate, and a side face of the resin layer that includes the boundary, is an obtuse angle. The step coverage of the cover layer is enhanced thanks to the angle between the exposed face and the side face being an obtuse angle. This affords a highly reliable cover and makes for yet superior article reliability.

Preferably, the distance between the exposed face of the terminal electrode body that is furthest away from the substrate, and the surface of the substrate on the side of the terminal electrode body, becomes smaller toward the front edge of the terminal electrode body, and the cover layer extends from the exposed face to the surface of the substrate. The length by which the cover layer hugs a side face of the terminal electrode body at the front edge of the terminal electrode body is then shorter than is the case when the exposed face is parallel to the substrate surface. This reduces therefore the likelihood of a break of the cover layer at the side face, while allowing the cover layer to cover the boundary between the side face and the substrate surface. The cover layer, which protects thus the boundary between the side face and the substrate surface, exhibits therefore no characteristic variation between articles.

Preferably, the substrate comprises a ceramic substrate having layered thereon a smoothing resin layer or an inorganic layer. The ceramic substrate, which is known as a substrate having relatively high insulating properties and rigidity, may have minute irregularities formed on the surface thereof. In that case, the smoothing resin layer or the inorganic layer is formed on the ceramic substrate with a view to evening out such irregularities. A resin is preferably used, since this affords sufficient smoothing even for larger irregularities in the substrate surface. When the coefficient of thermal expansion of the smoothing resin layer is substantially greater than that of ceramics, forming an inorganic layer as well on the top, in addition to the smoothing resin layer, allows achieving electronic elements boasting yet higher reliability, in which the influence of delamination is further suppressed.

The contour of the resin layer formed on the electronic element, as seen from a direction perpendicular to the substrate, includes preferably curved corners. This reduces the stress generated on account of the difference between the coefficient of thermal expansion of the corners of the resin layer and the underlay thereof, thus suppressing resin layer delamination.

The thin film device manufacturing method according to the present invention is a method for manufacturing a thin film device having an electronic element formed on a substrate, the method comprising the steps of forming on a substrate a terminal electrode body electrically connected to an electronic element; covering the electronic element with a resin layer; exposing the terminal electrode body to the exterior relative to the resin layer by patterning the resin layer; sputter-etching an oxide of the terminal electrode body formed on the terminal electrode body; covering with a cover layer a boundary between the terminal electrode body and the resin layer; and washing with an etching solution a thin film device intermediate having the cover layer formed thereon, wherein the cover layer comprises a material having a slower etching rate in an etching solution than the etching rate of the oxide of the terminal electrode body.

In such a method, the oxide of the terminal electrode body is removed by sputter etching, and then etching is carried out after covering the boundary with the cover layer. Since the boundary is covered thus by the cover layer, the etching solution does not penetrate into the boundary, thus inhibiting resin layer delamination. Moreover, the oxide of the terminal electrode body is removed, and hence contact having low electric resistance can be achieved when a metal layer is formed on the terminal electrode body. That is, the thin film device manufacturing method further comprises, preferably, the step of forming a metal layer on the cover layer. Such a method allows manufacturing a highly reliable thin film device.

In this method as well, for the reasons stated above, the terminal electrode body comprises preferably a layer comprising Cu, and the cover layer comprises a layer comprising Cr or Ti. Preferably, also, the metal layer comprises a layer comprising Sn or Au. The thin film device of the present invention has high reliability, and the manufacturing method of the present invention allows manufacturing a thin film device having high reliability.

BRIEF DESCRIPTION OF THE DRAWINGS

FIG. 8A is a cross-sectional diagram of the thin film device 100 along the arrow VIII-VIII;

FIG. 8B is a cross-sectional diagram of a thin film device before formation of a cover layer 10.

DESCRIPTION OF THE PREFERRED EMBODIMENTS

Figure 1:
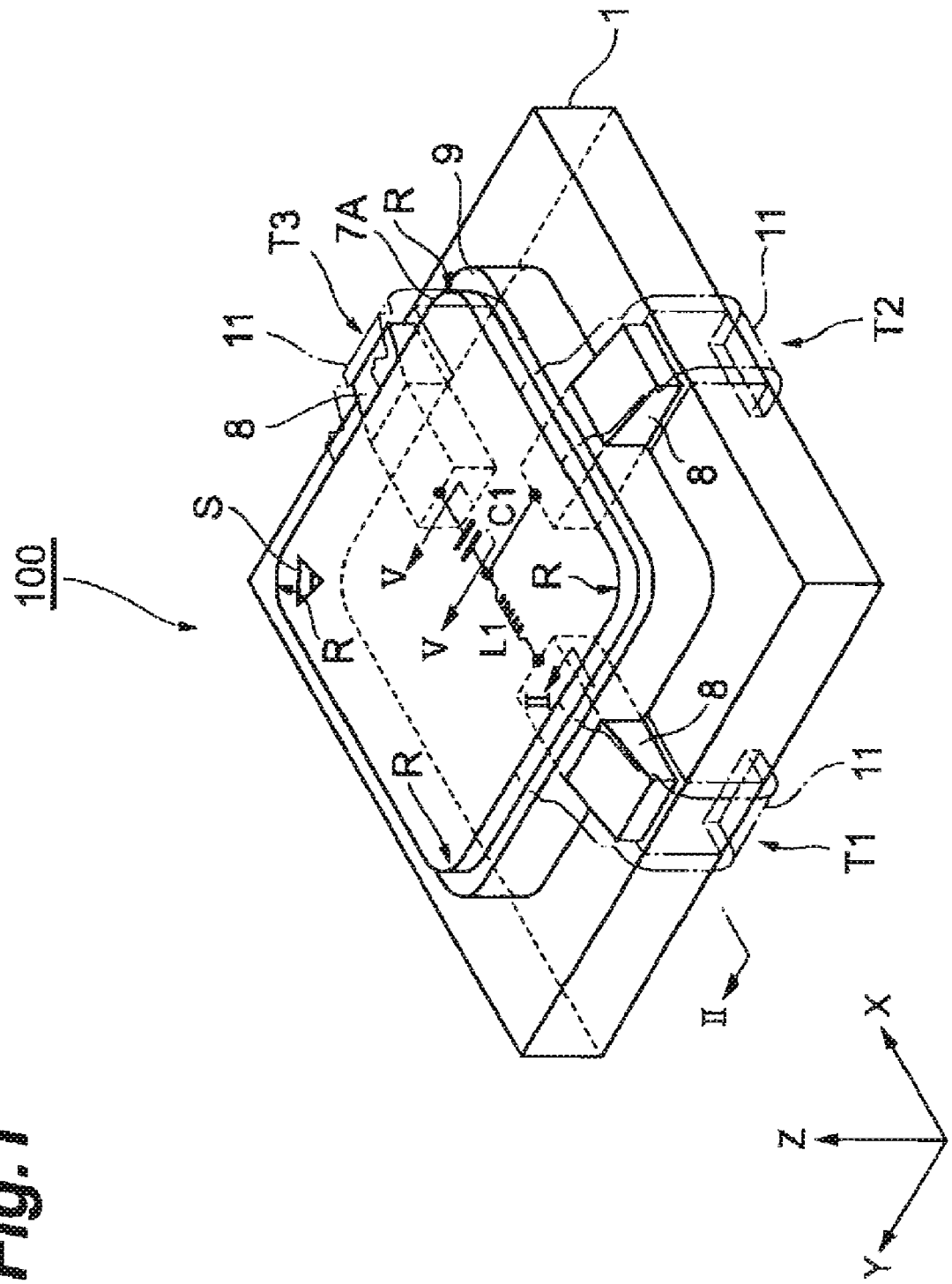
FIG. 1 is a perspective-view diagram of a thin film device 100.

A thin film device and a manufacturing method thereof, according to a concrete embodiment, are explained below. In the drawings, identical elements are denoted with identical reference numerals, and recurrent explanations thereof are omitted.

Figure 9:
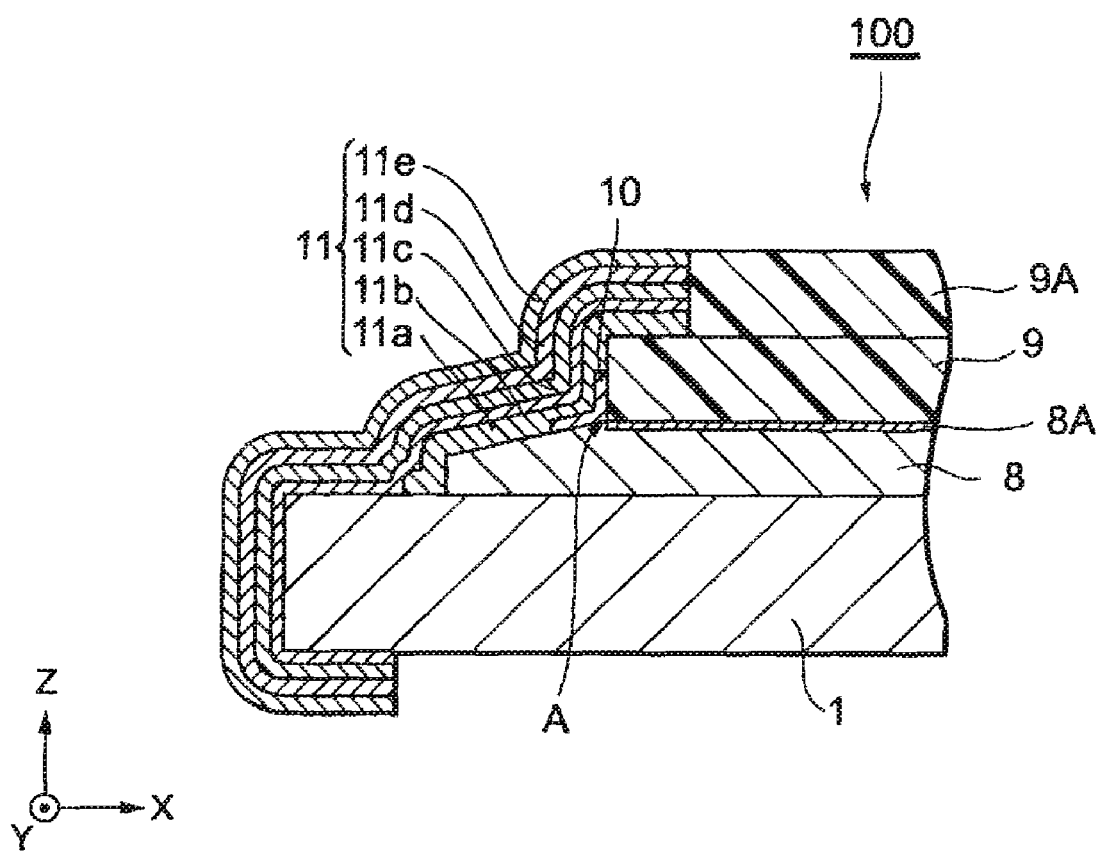
FIG. 9 is a cross-sectional diagram of the thin film device 100 illustrated in FIG. 1 along the arrow II-II.

FIG. 1 is a perspective-view diagram of a thin film device 100. FIG. 9 is a cross-sectional diagram of the thin film device 100 illustrated in FIG. 1 along the arrow II-II.

The thin film device 100 in the present example is a three-terminal filter comprising three terminal electrodes T1, T2, T3 formed on the surface of a substrate 1 that is formed of an insulating material such as alumina ($Al_2O_3$), $SiO_2$ or the like. On the surface of the substrate 1 there are formed a capacitor C1 and a coil L1 as plural electronic elements that are covered by two-layer resin layers 9, 9A for protection. The resin layers 9, 9A may comprise a one-layer resin layer, or a resin layer having three or more layers. In an XYZ three-dimensional coordinate system, the surface of the substrate 1 coincides with the XY plane, while the thickness direction of the resin layers 9, 9A coincide with the Z-axis direction.

The structure of the terminal electrodes T1, T2, T3 is identical. Such a structure comprises a terminal electrode body 8 positioned inside, and a metal layer 11 covering the surface of the terminal electrode body 8. The terminal electrode body 8 is electrically connected to the coil L1 and the capacitor C1, and is exposed on the substrate 1 relative to the resin layers 9, 9A, protruding out of the sides of the resin layers 9, 9A. That is, the terminal electrode body 8 is not covered by the resin layers 9, 9A. The electronic element is protected by the resin layers 9, 9A. The terminal electrode body 8 and the electronic element are electrically connected, so that applying an electric signal to the terminal electrode body 8 allows transmitting the electric signal to the electronic element.

A cover layer 10 covers the terminal electrode body 8 and the boundary A between the terminal electrode body 8 and the resin layer 9 (see FIG. 9).

The terminal electrodes T1, T2, T3 are electrically connected to a filter comprising the coil L1 and the capacitor C1. The filter of the present example can function as a low-pass filter, by making the terminal electrode T2 into an input terminal, the terminal electrode T1 into an output terminal, and connecting the terminal electrode T3 to ground.

When used as a filter, the various terminals may need to be positioned. In the case of two or four symmetrically arranged terminal filters, for instance, it is necessary to discriminate whether a given terminal is a terminal electrode, for each terminal. In the present example, the resin layers 9, 9A comprise a photosensitive photoresist having an identification mark S patterned thereon at a position offset from the barycenter of the surface, to allow distinguishing the respective terminal electrodes. So far as it allows distinguishing the respective terminal electrodes, the identification mark S may be shaped as a triangle, circle, square, or an asymmetric design pattern that includes the barycenter of the surface of the resin layer. The identification mark S allows doing away with the process for discriminating device orientation during manufacture and assembly.

Other known filter structures include, in addition to low-pass filter, high-pass filter and bandpass filter. Herein, any such structure can be formed by appropriately modifying the number and connection relationship of the coils and capacitors formed inside the resin layer 9. A resistor can also be provided additionally as an electronic element.

The resin layers 9, 9A comprise a photosensitive resin material, such as photosensitive polyimide or the like, that can be patterned by photolithography. Examples of a photosensitive resin material include, for instance, a material comprising mainly a non-novolac resin, preferably a negative photosensitive material (negative photoresist). More specific examples include polyimide resins (photosensitive polyimide), epoxy resins (photosensitive epoxy), phenolic resins other than novolac resins, silicone resins and the like, optionally containing inorganic materials such as alumina, ferrite or the like. In terms of reliability, a photosensitive polyimide resin is most preferably used among the foregoing.

The resin layers 9, 9A are formed within a region positioned inward of the outermost periphery of the substrate 1 by a given distance. The resin layers 9, 9A are structured so as not to be damaged during chip processing by dicing or the like. The resin layer 9A is arranged more inward of the thin film device than the resin layer 9. This allows controlling the forming region of the metal layer 11, and allows preventing short-circuits between electrode terminals caused by the metal layer 11 being formed over a wider area than expected. At the same time, increasing the layers that protect the electronic element allows enhancing the reliability of the thin film device. The corners R of the resin layers 9, 9A are rounded to a circular arc shape. That is, the contour of the resin layers 9, 9A, as seen from a direction perpendicular to the substrate 1 (Z-axis), includes curved corners R that reduce the stress generated on account of the difference between the coefficient of thermal expansion of the corners R of the resin layers 9, 9A and the underlay thereof. This suppresses, as a result, delamination of the resin layers 9, 9A.

The side faces of the terminal electrodes T1, T2, T3 inside the resin layer 9 are in contact with the resin layer 9. Alternatively, the side feces in three directions are in contact with the resin layer 9 and the bottom face is in contact with the substrate. In the present example, the shape of the resin layers 9, 9A for protection can be determined by mask design, which allows dealing with shapes for covering complex element structures. Also, using as the resin layers 9, 9A photosensitive resins whose thickness can be easily controlled by spin coating or the like allows achieving a smaller resin thickness, affording thereby a low-profile device.

With reference to FIG. 9, the cover layer 10 covers the boundary A, while the cover layer 10 is covered by the metal layer 11. The metal layer 11 extends over the surface of the cover layer 10 from the top face of the resin layer 9 up to the top face, side face (YZ plane) and reverse (XY plane in the Z-axis negative direction) of the substrate 1. Since the metal layer 11 extends down to the reverse of the substrate, the low-profile thin film device 100 can be connected by flip-chip bonding or the like.

That is, the metal layer 11 is exposed to the exterior (air), which allows hence connecting electrically wiring or the like to the metal layer 11. The metal layer 11 comprises preferably a metal having excellent contact with wiring and that does not oxidize readily. The metal layer 11 is obtained by sequential layering of a Cu layer 11a, a Cu/Cr layer 11b, a Cu layer 11c, a Ni layer 11d, and a Sn layer 11e. The Ni layer 11d is provided to prevent the Cu layer 11c from reacting with the Sn layer 11e. In the Cu/Cr layer 11b, the Cr layer formed by sputtering is positioned inward, affording increased adherence toward the inward and outward layers of the Cr layer. The outer Cu layer 11c, formed by plating, is designed to a larger thickness than the inward Cu layer formed by sputtering.

Herein, the cover layer 10 comprises a material having a slower etching rate in an etching solution than the etching rate of an oxide of the terminal electrode body 8. Thanks to such a structure, the boundary is covered by the cover layer 10 having high etching resistance, even when the thin film device 100 is exposed to the etching solution (hydrochloric acid, sulfuric acid or the like) for etching the oxide of the terminal electrode body 8. This suppresses as a result delamination of the resin layer 9, and reduces variation in the electric characteristics of the finished articles. The thin film device 100 boasts thus excellent reliability.

Exposure to such an etching solution may take place during or after manufacture of the thin film device 100. Under adequate temperature conditions, the portion between the terminal electrode body 8 and the resin layer 9 may be exposed to air moisture. Such moisture may evolve into a liquid by containing appropriate acidic atoms of the surrounding metal or air, and the liquid corrodes the oxide over long periods of time. The thin film device 100 of the present invention has excellent resistance against such environmental occurrences.

Preferably, the terminal electrode body 8 comprises a layer comprising Cu (or Al), and the cover layer 10 comprises a layer comprising Cr (or Ti). Preferably, the metal layer 11 comprises a layer comprising Sn or Au. The terminal electrode body 8 comprising Cu (or Al) oxidizes readily. Copper oxide exhibits a large etching rate in acidic etching solutions, but the etching rate of Cr (or Ti) in an etching solution is smaller than that of copper oxide. Herein Cr, which is a metal having excellent adherence, is preferred as it allows sufficiently inhibiting penetration of the etching solution into the boundary A (boundary line) between the edge of the resin layer 9 and the terminal electrode body 8. Sn or Au is a metal having high oxidation resistance. A surface of Sn or Au, therefore, does not readily oxidize, affording thus excellent wiring contact reliability, even when the thin film device is left to stand.

An oxide 8A of the terminal electrode body 8 is interposed between the resin layer 9 and the region of the terminal electrode body 8 covered by the resin layer 9. The oxide 8A provided between the resin layer 9 and the terminal electrode body 8 allows suppressing intrusion of water between the foregoing, and allows curbing also electric characteristic variation between finished articles caused by differences in the degree of contact.

Figure 2:
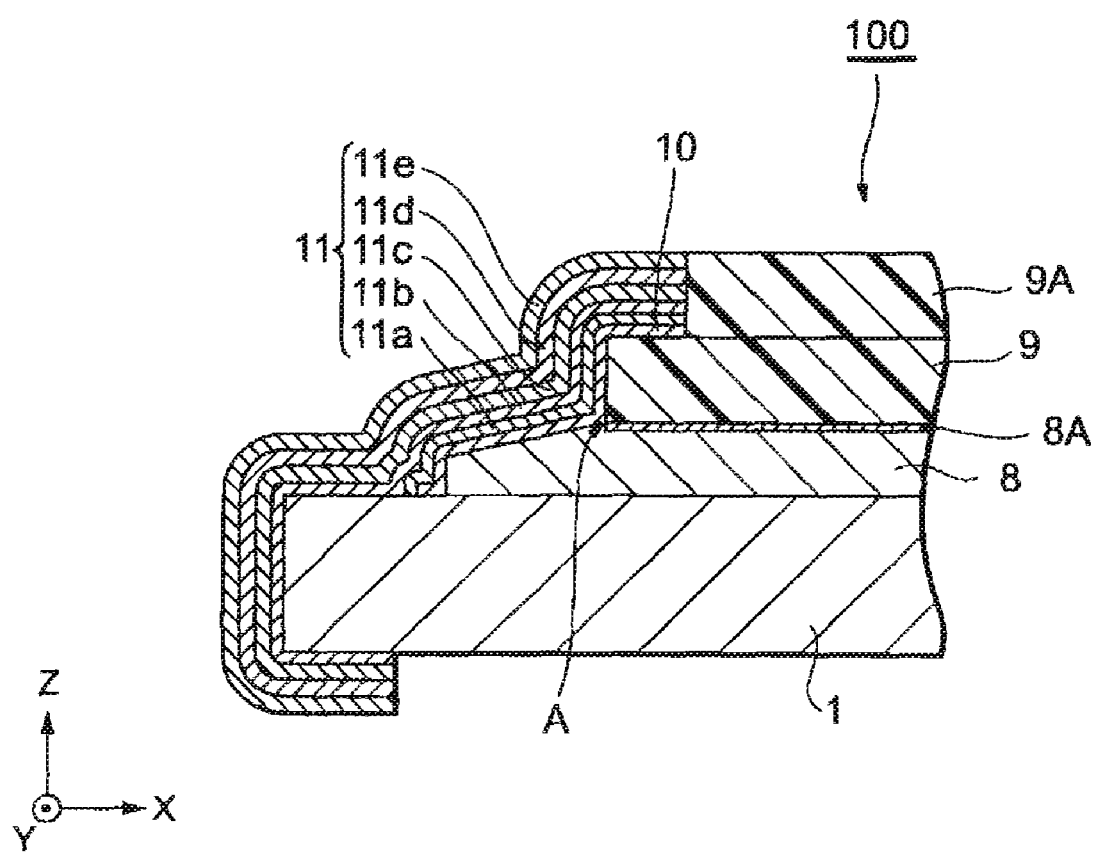
FIG. 2 is a cross-sectional diagram of the thin film device 100 illustrated in FIG. 1 along the arrow II-II.

FIG. 2 is a cross-sectional diagram illustrating a thin film device according to a modification of the cross section illustrated in FIG. 9.

In this thin film device, the cover layer 10 covers the boundary A but extends from the top face of the resin layer 9 to the surface of the substrate 1. In such a structure, the cover layer 10 protects sufficiently the surface of the terminal electrode body 8 while covering the boundary B (see FIG. 3) between the substrate 1 and the terminal electrode body 8.

Figure 3:
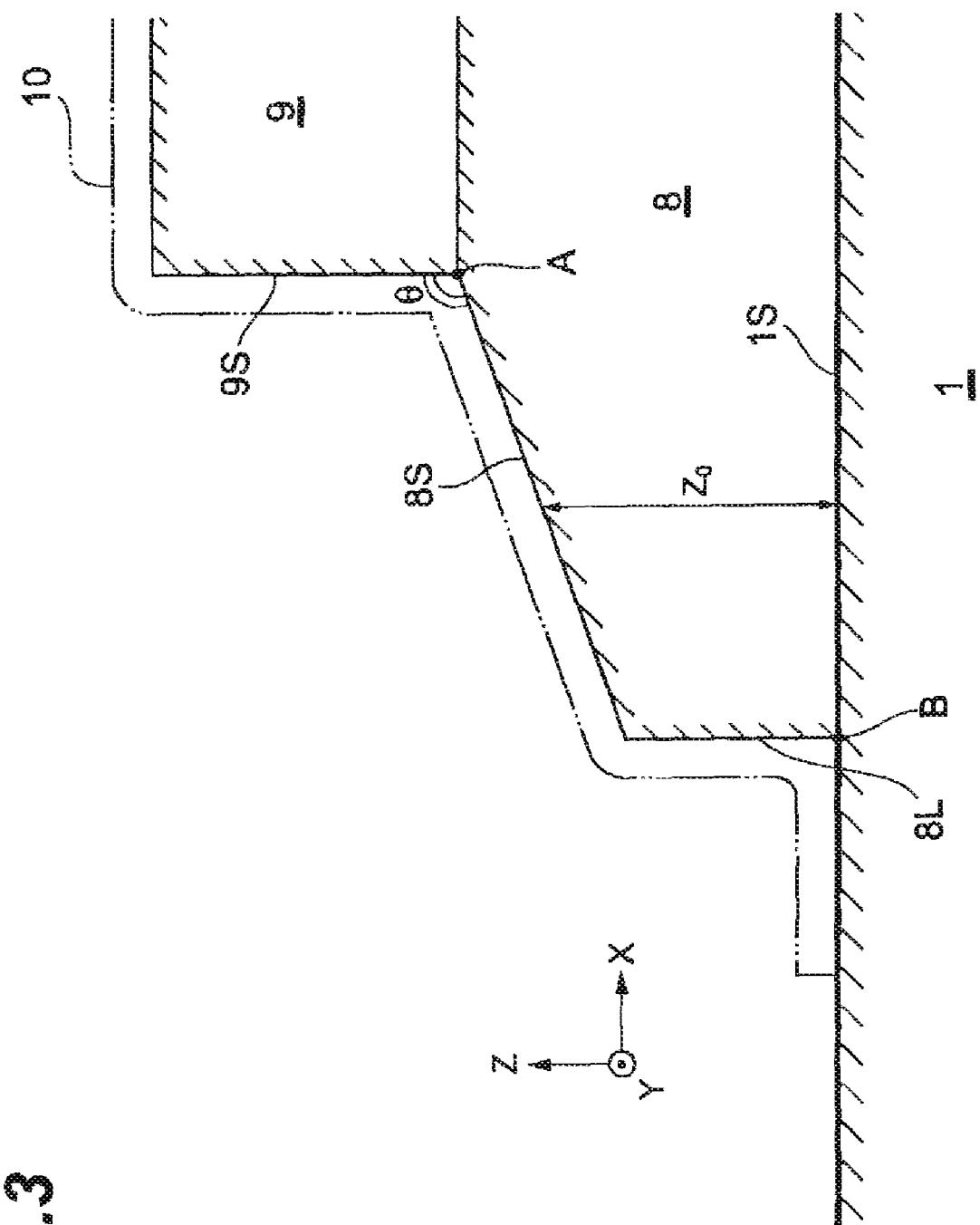
FIG. 3 is a diagram illustrating schematically the positional relationship between a substrate 1, a terminal electrode body 8 and a resin layer 9.

FIG. 3 is a diagram illustrating schematically the positional relationship between the substrate 1, the terminal electrode body 8 and the resin layer 9.

The angle θ formed between the exposed face 8S of the terminal electrode body 8 that is furthest away from the substrate 1, and a side face 9S of the resin layer 9 that includes the boundary A, is an obtuse angle. The angle θ may be, for instance, 120 degrees. The step coverage of the cover layer 10 is enhanced since the angle θ between the exposed face 8S and the side face 9S is an obtuse angle. The cover is thus excellent in reliability and makes for yet superior article reliability.

The distance Z0 between the exposed face 8S of the terminal electrode body 8 that is furthest away from the substrate 1, and the surface 1S of the substrate 1 on the side of the terminal electrode body 8, becomes smaller toward the front edge of the terminal electrode body 8 (−X direction). Preferably, the cover layer 10 extends from the exposed face 8S to the surface 1S of the substrate. Herein, the length by which the cover layer 10 hugs a side face 8L of the terminal electrode body 8 at the front edge of the terminal electrode body 8 is shorter than is the case when the exposed face 8S is parallel to the substrate surface 1S. This reduces, therefore, the likelihood of a break of the cover layer 10 at the side face 8L, while allowing the cover layer 10 to cover the boundary (boundary line) B between the side face 8L and the substrate surface 1S. The cover layer 10, which protects thus the boundary B between the side face 8L and the substrate surface 1S, exhibits therefore no characteristic variation between finished articles.

Figure 4:
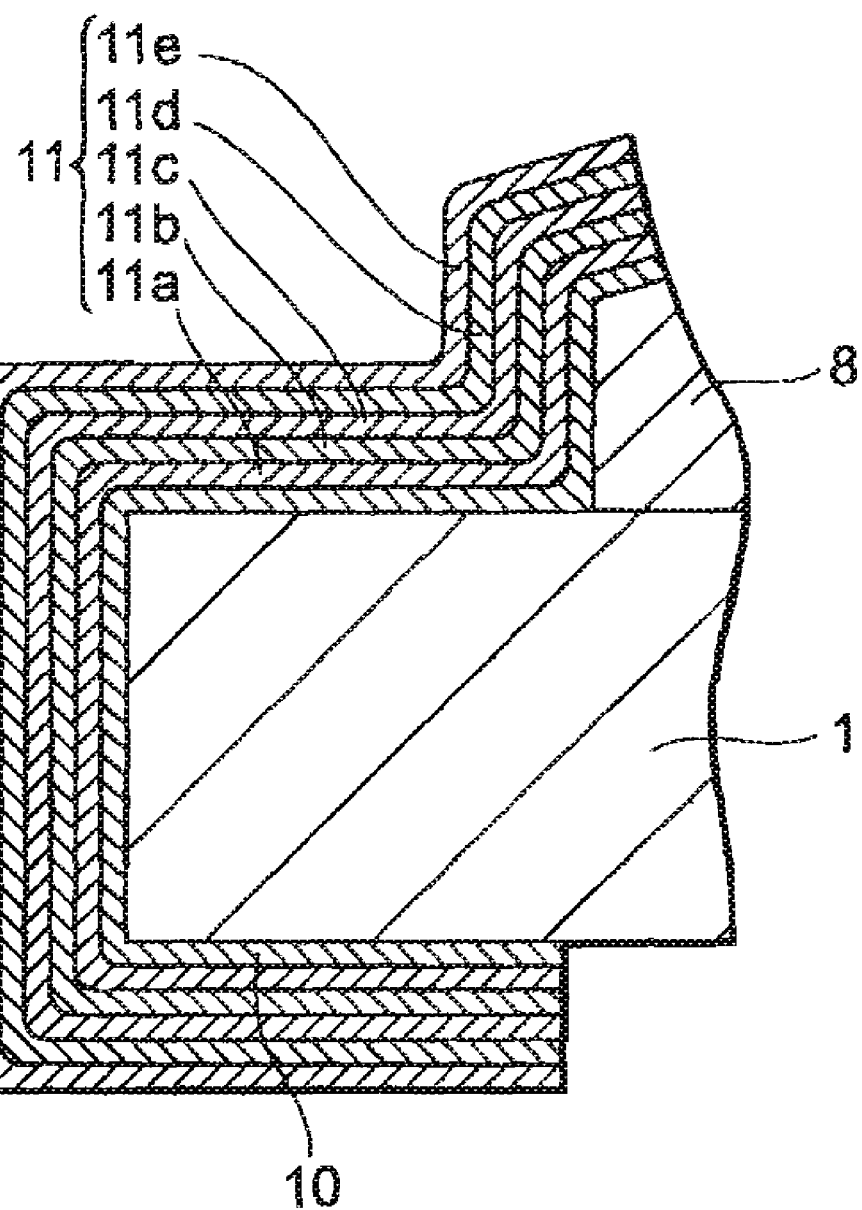
FIG. 4 is a cross-sectional diagram of the vicinity of a terminal.

The cover layer 10 may extend down to the reverse of the substrate 1, as illustrated in FIG. 4.

Figure 5:
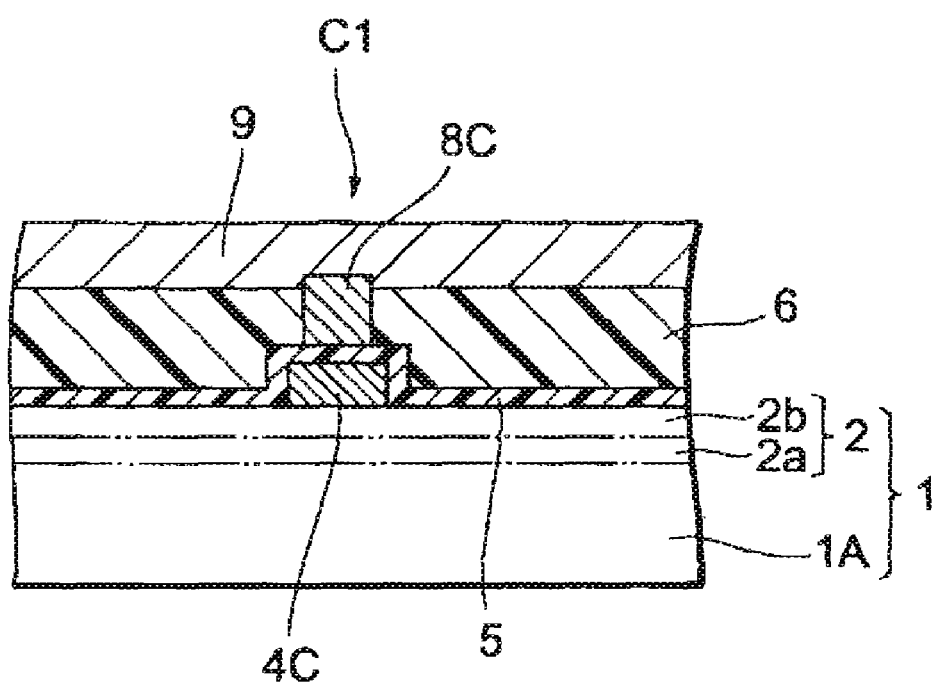
FIG. 5 is a cross-sectional diagram of the thin film device 100 illustrated in FIG. 1 along the arrow V-V.

FIG. 5 is a cross-sectional diagram of the thin film device 100 illustrated in FIG. 1 along the arrow V-V.

FIG. 5 illustrates an example of the capacitor C1, although various such capacitor structures are known. Herein, a smoothing resin layer 2a and an inorganic insulating layer 2b are sequentially formed on a ceramic substrate 1A. The ceramic substrate 1A, comprising $Al_2O_3$ or the like, is known as a substrate having relatively high insulating properties and rigidity. The ceramic substrate 1A has minute irregularities on the surface thereof. The smoothing resin layer 2a is formed on the ceramic substrate 1A in order to even out such irregularities. The smoothing resin layer 2a, however, has a greater coefficient of thermal expansion than ceramics. Thus, when wiring or an electronic element such as a capacitor or the like is formed on the smoothing resin layer 2a, the formed electronic element or wiring are subjected to stress on account of thermal expansion or contraction, becoming impaired as a result.

On the other hand, forming the inorganic insulating layer 2b on the smoothing resin layer 2a has the effect of insulating the electronic element or wiring formed on the inorganic insulating layer 2b while curbing the influence of thermal expansion or contraction of the smoothing resin layer 2a on the electronic element or wiring. This reduces as a result the stress placed on the electronic element or wiring formed on the inorganic insulating layer 2b, and allows enhancing the reliability of the electronic element or wiring. In the present example, the inorganic insulating layer 2b comprises $Al_2O_3$. The smoothing resin layer 2a and the inorganic insulating layer 2b make up a substrate smoothing layer 2.

The capacitor C1 comprises a lower electrode layer 4C interposed between the dielectric layer 5 and the substrate 1, and an upper electrode layer 8C formed on the dielectric layer 5. The capacitance of the capacitor is prescribed by the opening dimensions of an insulator 6. The surface of the capacitor is covered by a protective insulating layer 9. The insulating layer 9A illustrated in FIG. 1 may be formed on the insulating layer 9.

Figure 6:
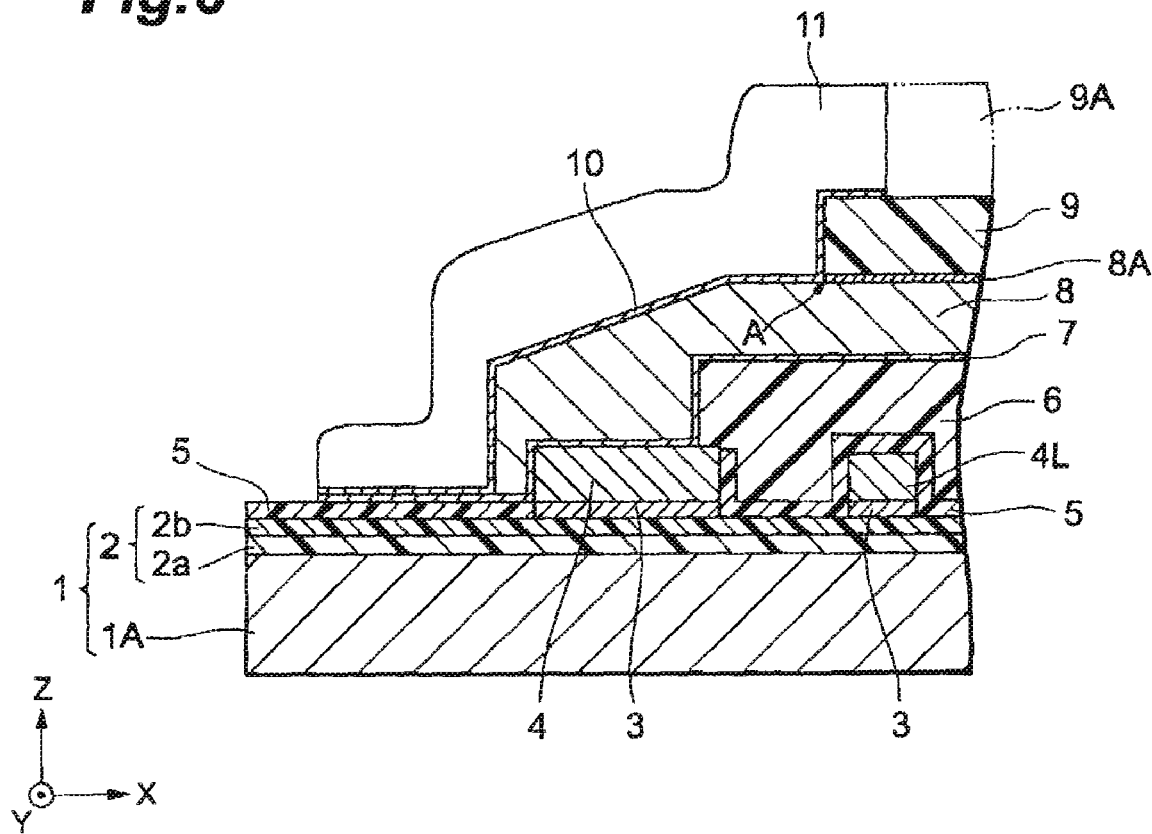
FIG. 6 is a cross-sectional diagram of the vicinity of a terminal electrode in more detail.

FIG. 6 is a cross-sectional diagram of the above-described vicinity of a terminal electrode in more detail.

The dielectric layer 5 and a plating seed layer (Cu) 3 are formed on the surface of the substrate 1, a lower electrode (Cu) 4 is formed on the plating seed layer 3, and an insulating layer 6 is formed thereon. On the lower electrode 4 and the insulating layer 6 there is formed an upper electrode plating seed layer (Cu) 7, and the terminal electrode body 8, as an upper electrode, is formed on the upper electrode plating seed layer 7. The insulating layer 9A illustrated in FIG. 1 may optionally not be formed. FIG. 6 depicts also a metal wiring 4L that makes up part of the coil L1. The substrate 1 comprises the ceramic substrate 1A and the substrate smoothing layer 2. The metal layer 11 does not extend herein to the reverse of the substrate 1, but otherwise the constitution is identical to the constitution described above. The metal layer 11 is depicted without hatching.

Figure 7B:
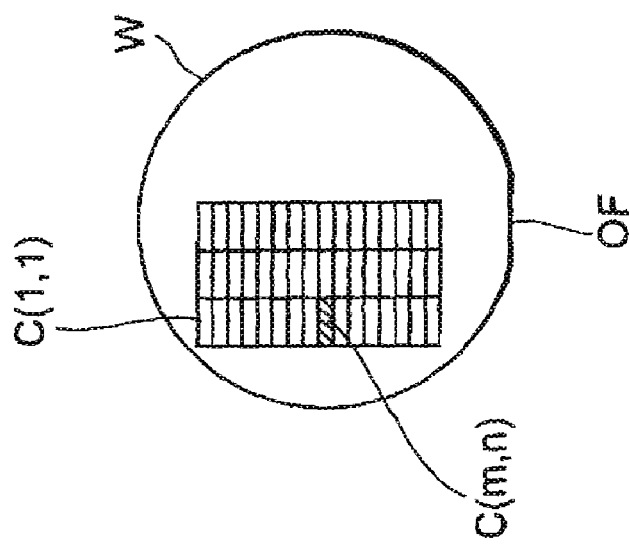
FIG. 7B is a plan-view diagram of a wafer.
Figure 7A:
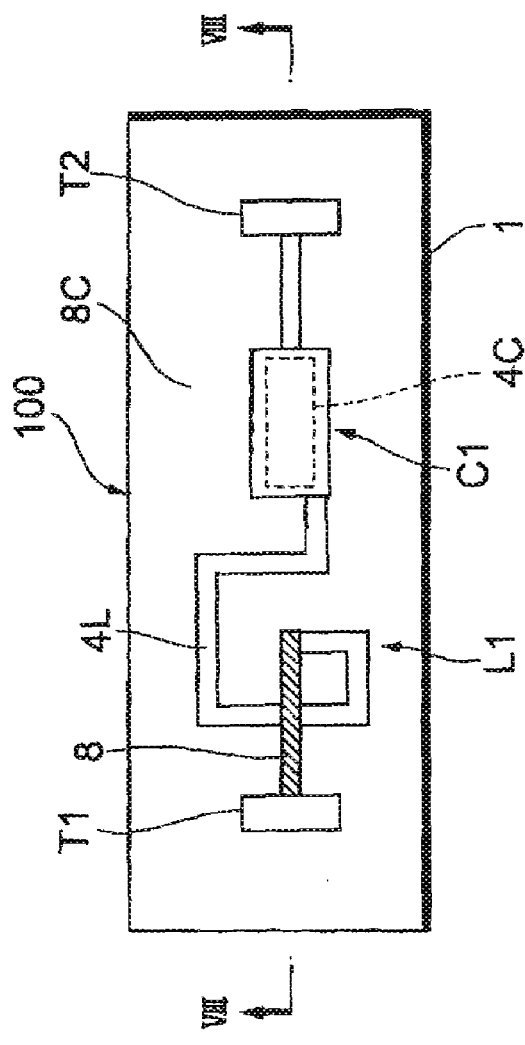
FIG. 7A is a schematic plan-view diagram of the thin film device 100.

FIG. 7A is a plan-view diagram illustrating the thin film device 100, having the structure depicted in FIG. 6, as an enlarged view of one chip (m, n) illustrated in FIG. 7B.

In the present example there is illustrated an LC circuit having two terminals T1, T2. The terminal T1 is connected via the terminal electrode body 8 to a coil L1 in which the metal wiring 4L is shaped as a spiral. The capacitor C1 is connected to the coil L1 and to the terminal T2. The protective resin layers and so forth are not shown in the figure.

The thin film device 100, as illustrated in FIG. 7B, comprises a chip (m, n) diced from a wafer W. A plurality of the chips (m, n) are formed on the wafer W in a matrix array, such that the row direction thereof is parallel to an orientation flat OF.

FIG. 8A is a cross-sectional diagram of the thin film device 100 illustrated in FIG. 7A along the arrow VIII-VIII.

The terminal electrode body 8 at the right end and an upper electrode 8C of the capacitor C1 comprise the same metal layer. The terminal electrode body 8 at the left end is electrically connected to the metal wiring 4L of the coil L1. Otherwise, the structure of me thin film device 100 is identical to the structure described above.

FIG. 8B is a cross-sectional diagram of a thin film device before formation of the cover layer 10. In a washing operation using an acidic etching solution, the latter penetrates into the boundary A and etches the oxide 8A. When the cover layer 10 is formed, on the other hand, the etching solution does not penetrate into the boundary, which is advantageous.

A manufacturing method of the thin film device 100 will be explained next. Firstly, the terminal electrode body 8 electrically connected to the electronic element is formed on the substrate. The electronic element is then covered by the resin layer 9. The resin layer 9 is patterned, so that the terminal electrode body 8 becomes exposed to the exterior relative to the resin layer 9. The oxide 8A formed on the terminal electrode body 8 is etched by sputtering.

Thereafter, the boundary A between the terminal electrode body 8 and the resin layer 9 is covered by the cover layer 10. The thin film device intermediate having the cover layer 10 formed thereon is washed with the above-described etching solution.

In such a method, the oxide 8A of the terminal electrode body 8 is removed by sputter etching, and then etching is carried out after covering the boundary A with the cover layer 10. The boundary A becomes covered therefore with the cover layer 10, so that the etching solution does not penetrate into the boundary. This suppresses delamination of the resin layer 9. Since the oxide 8A of the terminal electrode body 8 is removed, low electric resistance contact is achieved when the metal layer 11 is formed on the terminal electrode body 8. That is, the metal layer 11 is further formed on the cover layer 10. Such a method allows manufacturing a highly reliable thin film device 100.

More specifically, a ceramic substrate (hereinafter, wafer) comprising alumina or the like is subjected to a smoothing treatment such as chemical mechanical polishing (CMP) or the like, and then the lower electrode plating seed layer 3 is formed thereon using a sputtering machine. Cu is used as the plating seed layer 3, with Ti and Cr interposed, as an adhesion layer, with the substrate 1.

To form then the lower electrode wiring 4, 4L, 4C, a positive photoresist is applied by spin coating onto the plating seed layer 3, and then a resist pattern is formed through exposure and development using a photomask.

Next, the seed layer 3 is electroplated, to form the lower electrode layer 4, 4L, 4C at photoresist-free portions. From the viewpoint of conductivity and economy, Cu is preferably used as the electrode material. The thickness of the outer surface, which varies depending on the frequency band of the used electronic device, can be adjusted in accordance with such frequency band. Preferably, however, the thickness of the electrode layer is 3 to 15 um. After electroplating, the resist pattern is stripped off, and the surplus plating seed layer 3 is removed by wet etching or ion milling, to form the lower electrode wiring pattern.

The dielectric film 5 is formed next on the lower electrode wiring pattern across the whole wafer. The dielectric film 5 can be formed by, for instance, evaporation, sputtering or CVD (chemical vapor deposition), using $SiO_2$, $Si_3N_4$, $Al_2O_3$, AlN, $ZrO_2$, $NbO_2$, $Ta_2O_5$, $TiO_2$, $SrTiO_3$ or the like.

Next there is formed the insulating resin layer 6 that determines the opening dimension of the capacitor C1, and which functions as insulation between the lines and layers of the coil L1. The insulating resin layer 6 is formed by applying an insulating resin, typified by polyimide, through spin coating, followed by exposure, development and hearing.

Next, there are removed the insulating layer 6 at portions where the upper electrode 8L and the lower electrode 4L of the coil L1 connected, and the dielectric film 5 adhered to the terminal electrode body 8, as the terminal lead-out electrode. Only the portions corresponding to the foregoing are opened. At other portions, the surplus dielectric film is removed by dry etching or ion milling after manufacture of a resist pattern covered with a resist.

The Cu of the seed layer 7 of the upper electrode is formed next by sputtering, in the same way as the lower electrode, via an adhesion layer of Cr, Ti or the like. A resist pattern is formed next corresponding to the wiring pattern of the upper electrode. This is followed by electroplating, resist stripping, and removal of surplus plating seed layer, to form an upper electrode wiring pattern as the terminal electrode body 8. A photosensitive resin, typified by polyimide, is used to form the sealing resin layer 9 formed next. The photosensitive resin is applied by spin coating, and is then exposed and developed to form a pattern covering portions other than the terminal electrode body 8, as the terminal lead-out electrode, after which the photosensitive resin is heat-cured.

Hereafter, in a working example, films of Cr or Ti, and subsequently Cu, are sputtered over the entire wafer to form a plating seed layer. With a view to increasing adherence with the underlayer, sufficient sputter etching is carried out to remove the oxide layer on the electrode 8 and to remove material adsorbed onto the insulating resin layer. A resist pattern is formed next, followed by electroplating, resist stripping, plating seed layer removal and formation of the cover layer 10, as a terminal electrode protective layer.

The reverse of the wafer is then thinned by polishing down to a desired thickness, followed by segmenting of the wafer by dicing. In the segmentation operation, water comes into contact with the elements, oxidizing the surface of the lead-out electrodes, while the organic polishing liquid adheres to the element. Therefore, the segmented elements are subjected to a pre-treatment such as acid washing, defatting and the like, for the formation of a side terminal electrode. The metal layer 11, as a side terminal, is formed by forming a plating underlayer using a metal mask, followed by barrel plating.

As a comparative example, a thin film device was manufactured without forming the cover layer 10.

In the comparative example, manufactured elements were left to stand for 168 hours in a thermo-hygrostat at 85° C. and 85% humidity. The results showed impaired element characteristics, with half the elements exhibiting discoloration of the wiring layers on account of water penetration via the terminals. Such impaired element characteristics are believed to arise from minute interstices at the oxide film interface that result from dissolution of the oxide film during acid washing, prior to formation of the side terminals, in a reliability test. By contrast, no such impairment was observed in thin film devices according to the working example.

What is claimed is:

1. A thin film device having an electronic element formed on a substrate, comprising:
    a resin layer covering said electronic element;
    a terminal electrode body electrically connected to said electronic element and exposed to the exterior relative to said resin layer on said substrate; and
    a cover layer covering a boundary between said terminal electrode body and said resin layer,
    wherein said cover layer comprises a material having a slower etching rate in an etching solution than the etching rate of an oxide of said terminal electrode body.

2. The thin film device according to claim 1, wherein an oxide of said terminal electrode body is interposed between said resin layer and a region of said terminal electrode body covered by said resin layer.

3. The thin film device according to claim 1, wherein an angle formed between an exposed face of said terminal electrode body that is furthest away from said substrate, and a side face of said resin layer that includes said boundary, is an obtuse angle.

4. The thin film device according to claim 1, wherein the distance between an exposed face of said terminal electrode body that is furthest away from said substrate, and a surface of said substrate on the side of said terminal electrode body becomes smaller toward the front edge of said terminal electrode body,
    and wherein said cover layer extends from said exposed face to said surface of said substrate.

5. The thin film device according to claim 1, wherein said terminal electrode body comprises a layer comprising Cu or Al, and said cover layer comprises a layer comprising Cr or Ti.

6. The thin film device according to claim 1, wherein said substrate comprises a ceramic substrate having sequentially layered thereon a smoothing resin layer and an inorganic insulating layer.

7. The thin film device according to claim 1, wherein a contour of said resin layer has curved corners as seen from a direction perpendicular to said substrate.

* * * * *